United States Patent
Lanz

(10) Patent No.: US 8,377,219 B2
(45) Date of Patent: Feb. 19, 2013

(54) METHOD FOR CLEANING A SEMICONDUCTOR WAFER COMPOSED OF SILICON DIRECTLY AFTER A PROCESS OF POLISHING OF THE SEMICONDUCTOR WAFER

(75) Inventor: Reinhold Lanz, Burgkirchen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/311,577

(22) Filed: Dec. 6, 2011

(65) Prior Publication Data
US 2012/0152278 A1 Jun. 21, 2012

(30) Foreign Application Priority Data
Dec. 15, 2010 (DE) .......................... 10 2010 063 178

(51) Int. Cl.
*B08B 7/04* (2006.01)
(52) U.S. Cl. ............ 134/6; 134/25.1; 134/25.4; 134/26; 134/28; 134/29; 134/32; 134/33; 134/34; 134/36; 134/42; 134/902; 216/83; 216/92; 438/906; 438/928; 510/175
(58) Field of Classification Search ............ 134/6, 25.1, 134/25.4, 26, 28, 29, 32, 33, 34, 36, 42, 902; 216/83, 92; 438/906, 928; 510/175
See application file for complete search history.

(56) References Cited

U.S. PATENT DOCUMENTS

| | | | |
|---|---|---|---|
| 5,626,681 A | 5/1997 | Nakano et al. | |
| 5,723,019 A * | 3/1998 | Krusell et al. | ..................... 134/6 |
| 5,944,906 A | 8/1999 | Robinson | |
| 5,954,888 A | 9/1999 | Gupta et al. | |
| 6,125,861 A * | 10/2000 | Gupta et al. | ..................... 134/61 |
| 2005/0092348 A1 * | 5/2005 | Chiang et al. | ..................... 134/1 |
| 2006/0219275 A1 | 10/2006 | Weber et al. | |
| 2006/0272677 A1 | 12/2006 | Lee et al. | |
| 2008/0173335 A1 | 7/2008 | Yoon et al. | |
| 2008/0286697 A1 * | 11/2008 | Verhaverbeke et al. | ...... 430/322 |

FOREIGN PATENT DOCUMENTS

| | | |
|---|---|---|
| DE | 102007032385 A1 | 1/2009 |
| EP | 0708480 A1 | 4/1996 |
| WO | WO 2005006409 A1 | 1/2005 |
| WO | WO 2006109899 A1 | 10/2006 |

* cited by examiner

*Primary Examiner* — Bibi Carrillo
(74) *Attorney, Agent, or Firm* — Leydig, Voit & Mayer, Ltd.

(57) ABSTRACT

A method for cleaning a semiconductor wafer composed of silicon directly after a process of chemical mechanical polishing of the semiconductor wafer includes transferring the semiconductor wafer from a polishing plate to a first cleaning module and spraying both side surfaces of the semiconductor wafer with water at a pressure no greater than 1000 Pa at least once while transferring the semiconductor wafer. The semiconductor wafer is then cleaned between rotating rollers with water. The side surfaces of the semiconductor wafer are sprayed with an aqueous solution containing hydrogen fluoride and a surfactant at a pressure no greater than 70,000 Pa. Subsequently, the side surfaces are sprayed with water at a pressure no greater than 20,000 Pa. The wafer is then dipped into an aqueous alkaline cleaning solution, and then cleaned between rotating rollers with a supply of water. The semiconductor wafer is then sprayed with water and dried.

7 Claims, 2 Drawing Sheets second group first group

METHOD FOR CLEANING A SEMICONDUCTOR WAFER COMPOSED OF SILICON DIRECTLY AFTER A PROCESS OF POLISHING OF THE SEMICONDUCTOR WAFER

CROSS REFERENCE TO RELATED APPLICATIONS

This application claims priority from German Patent Application No. DE 10 2010 063 178.7, filed Dec. 15, 2010, which is incorporated by reference herein in its entirety.

FIELD

The invention relates to a method for cleaning a semiconductor wafer composed of silicon in respect of polishing agent residues directly after a process of chemical mechanical polishing of the semiconductor wafer.

BACKGROUND

Semiconductor wafers composed of silicon are generally subjected to a process of chemical mechanical polishing (CMP) for smoothing one or both sides of the semiconductor wafer. After the polishing process, the semiconductor wafers are contaminated with residues of the polishing agent and have to be cleaned. The residues have to be removed as rapidly as possible since they can attack the sensitive surface of the semiconductor wafer, and they have to be removed as completely as possible since particles remaining on the cleaned surface can cause surface defects which can no longer be removed later by cleaning. Furthermore, the cleaning must also be completed in the shortest possible time for economic reasons.

DE 10 2007 032 385 A1 describes a method for cleaning a semiconductor wafer after CMP in a modularly structured cleaning installation. The method provides for semiconductor wafers each individually being cleaned in at least two cleaning modules and dried in a drying module. A cleaning sequence which comprises three substeps and is aimed at removing metallic impurities is carried out in the same cleaning module.

In EP 0 708 480 A1, as an advantageous alternative to cleaning using a cleaning solution containing ammonium hydroxide, hydrogen peroxide and water, it is proposed that a semiconductor wafer, after a polishing process, is firstly cleaned using an aqueous solution of hydrofluoric acid, then rinsed using ozone-containing water, and finally cleaned using brushes in the presence of water.

U.S. Pat. No. 5,944,906 describes a method by which semiconductor wafers whose surfaces are formed by at least two different materials are cleaned after a polishing process. When this method is employed, the semiconductor wafer is successively treated with a series of aqueous cleaning solutions. The series comprises hydrofluoric acid, a surfactant solution having a pH in the range of 1 to 4, an aqueous ammonium hydroxide solution, a surfactant solution having a pH in the range of 8 to 10, and deionized water.

SUMMARY

An aspect of the present invention is to provide a cleaning method by which semiconductor wafers composed of silicon can, individually and with a high throughput effectively after a process of chemical mechanical polishing, be freed of residues of the polishing process on the polished front side and the rear side.

In an embodiment, the present invention provides a method for cleaning a semiconductor wafer composed of silicon directly after a process of chemical mechanical polishing of the semiconductor wafer, comprising the following steps in the order indicated:

a) transferring the semiconductor wafer from a polishing plate to a first cleaning module, wherein both side surfaces of the semiconductor wafer are sprayed at least once with water at a pressure of not more than 1000 Pa in the course of the transfer;
b) cleaning the semiconductor wafer between rotating rollers with supply of water;
c) spraying the side surfaces of the semiconductor wafer with an aqueous solution containing hydrogen fluoride and a surfactant, at a pressure of not more than 70 000 Pa;
d) spraying the side surfaces of the semiconductor wafer with water at a pressure of not more than 20 000 Pa;
e) dipping the semiconductor wafer into an aqueous alkaline cleaning solution;
f) cleaning the semiconductor wafer between rotating rollers with supply of water;
g) spraying the semiconductor wafer with water; and
h) drying the semiconductor wafer.

BRIEF DESCRIPTION OF THE DRAWINGS

Exemplary embodiments of the present invention are described in more detail below with reference to the drawings, in which.

DETAILED DESCRIPTION

Figure 2:
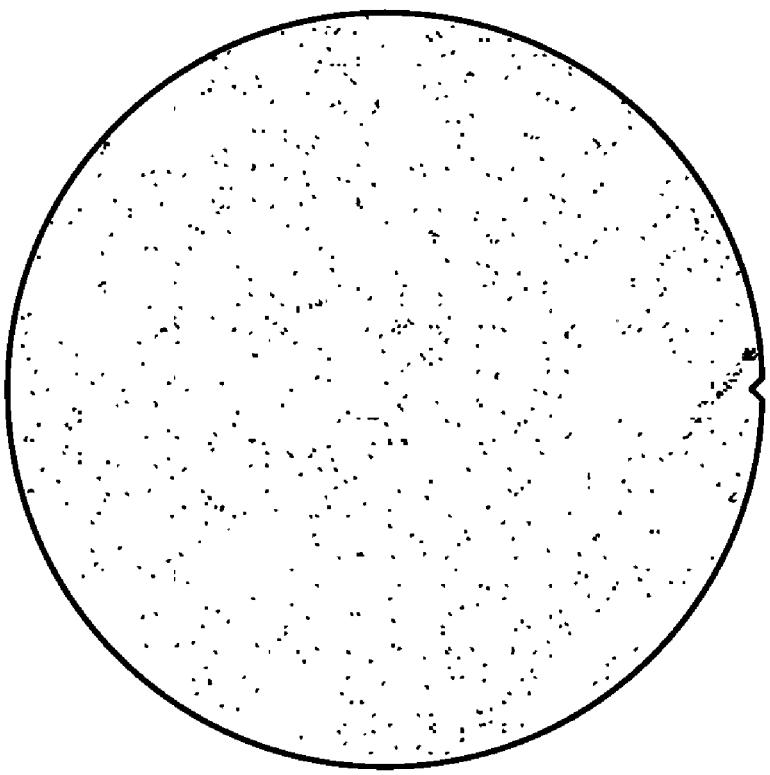
FIG. 2 shows a map of particles found on a semiconductor wafer cleaned in accordance with the invention.

Embodiments of a method in accordance with the invention enable the rapid and efficient cleaning of the polished front side and also of the rear side of a semiconductor wafer composed of silicon directly after a process of chemical mechanical polishing of the semiconductor wafer.

The semiconductor wafer is treated in different cleaning modules during the method. A cleaning module is a functional unit in which the semiconductor wafer is cleaned, either by spraying the side surfaces of the semiconductor wafer with a liquid, by dipping the semiconductor wafer into a bath, or by cleaning the semiconductor wafer between rotating rollers with supply of water or with supply of a cleaning solution. It is preferred for the semiconductor wafer to be rotated about its center during the abovementioned treatments in a cleaning module, preferably in a vertical plane.

The method comprises a specific sequence of operations which, in total, provide an embodiment of the present invention. A semiconductor wafer composed of silicon which has been cleaned in accordance with the method has, with regard to contamination by particles, a degree of purity which is already in the range of what is expected of polished semiconductor wafers composed of silicon which are about to be packaged and sent to the customer. At the same time, the method can be limited to no longer than 360 s, preferably not longer than 300 s, calculated from the transfer from the polishing plate in accordance with step a) until the completion of drying in step h) of the method, times during which the semiconductor wafers are transferred by robots being taken into account.

When the method is employed, the discharge of dried semiconductor wafers per unit time (cycle time) can be at least one semiconductor wafer per 75 s, preferably at least one semiconductor wafer per 66 s.

The method comprises the transfer from the polishing plate to a first cleaning module, cleaning steps b) to g) and, finally, the drying of the semiconductor wafer in a drying module. Preferably not more than three cleaning modules are used for carrying out cleaning steps b) to g) of the method, which contributes to a high throughput.

The water used for cleaning the semiconductor wafer is preferably deionized water.

At the beginning of the method, the semiconductor wafer that has residues of polishing agent adhering to its polished front side and to its rear side is transported as rapidly as possible from the polishing plate to a first cleaning module. In the course of this transfer, both sides of the semiconductor wafer are sprayed with water at least once, wherein the semiconductor wafer is preferably held in a manner lying horizontally or in a vertically upright manner. It is particularly preferred to transport the semiconductor wafer with the aid of a robot system gripping it at the edge to an acceptance station and to deposit it there, to spray it there with water in accordance with step a) of the method, and then to transport it further to the first cleaning module with the aid of the robot system. The spraying of the side surfaces with water preferably lasts not less than 1 s and not more than 10 s. If the time period is shorter than 1 s, then this detrimentally affects the efficiency of the method, and if it is longer than 10 s, then this is detrimental to the productivity of the method.

The pressure at which water is sprayed onto the side surfaces of the semiconductor wafer in the course of step a) of the method is not more than 1000 Pa (10 mbar). If the pressure at this point in the method is higher, there is the risk of surface defects being caused by the higher pressure when the freshly polished and therefore sensitive semiconductor wafer is sprayed with water, which surface defects can no longer be removed by cleaning later.

Steps b) to d) of the method are preferably carried out in the first cleaning module.

Step b) of the method comprises cleaning the semiconductor wafer between rotating rollers with supply of water. The rollers preferably have a sponge-like covering composed of a plastic such as polyvinyl alcohol, with which the semiconductor wafer comes into contact during cleaning. Rotating brushes are also suitable. The semiconductor wafer is preferably held vertically upright and rotated about its center during this treatment. Step b) of the method preferably lasts not less than 10 s and not more than 30 s. If the time period is shorter than 10 s, then this detrimentally affects the efficiency of the method, and if it is longer than 30 s, then this is detrimental to the productivity of the method.

Step c) of the method comprises spraying the side surfaces of the semiconductor wafer with an aqueous solution containing hydrogen fluoride and at least one surfactant. The semiconductor wafer is preferably held vertically upright and rotated about its center during this treatment. Step c) of the method preferably lasts not less than 20 s and not more than 30 s. If the time period is shorter than 20 s, then this detrimentally affects the efficiency of the method, and if it is longer than 30 s, then this is detrimental to the productivity of the method.

The concentration of hydrogen fluoride (HF) is preferably 0.5 to 1.5% by weight, and that of the surfactant is preferably 0.015 to 0.03% by weight. Consideration is preferably given to surfactants which contain one or more acid groups and accordingly form an aqueous solution having a pH of less than 7.

The pressure at which the aqueous solution is sprayed onto the side surfaces of the semiconductor wafer in the course of step c) of the method is not more than 70 000 Pa (0.7 bar) and preferably not less than 40 000 Pa (0.4 bar). If the pressure at this point in the method is higher, there is the risk of surface defects being caused when the semiconductor wafer is sprayed with the aqueous solution, which surface defects can no longer be removed by cleaning later. If the pressure is too low, the cleaning remains incomplete.

Step d) of the method comprises spraying the side surfaces of the semiconductor wafer with water. The semiconductor wafer is preferably held vertically upright and rotated about its center during this treatment. Step d) of the method preferably lasts not less than 1 s and not more than 10 s. If the time period is longer than 10 s, then this is detrimental to the productivity of the method.

The pressure at which water is sprayed onto the side surfaces of the semiconductor wafer in the course of step d) is not more than 20 000 Pa (0.2 bar). If the pressure at this point in the method is higher, there is the risk of surface defects being caused when the semiconductor wafer is sprayed with water, which surface defects can no longer be removed by cleaning later.

Step e) of the method is preferably carried out in a second cleaning module. It comprises dipping the semiconductor wafer into an aqueous alkaline cleaning solution. The semiconductor wafer is preferably held vertically upright and rotated about its center during this treatment. The cleaning solution preferably has a temperature of not less than 50° C. and not more than 60° C. It contains an alkaline compound, preferably tetramethylammonium hydroxide (TMAH) and, if appropriate, hydrogen peroxide ($H_2O_2$). The concentration of the alkaline compound is preferably in the range of 0.1 to 0.4% by weight, and that of hydrogen peroxide is preferably in the range of 0.7 to 1.5% by weight.

Step e) of the method preferably lasts not less than 40 s and not more than 60 s. If the time period is shorter than 40 s, then this detrimentally affects the efficiency of the method, and if it is longer than 60 s, then this is detrimental to the productivity of the method.

Steps f) and g) of the method are preferably carried out in a third cleaning module.

Step f) of the method comprises cleaning the semiconductor wafer between rotating rollers with supply of water. The rollers preferably have a sponge-like covering composed of a plastic such as polyvinyl alcohol, with which the semiconductor wafer comes into contact during cleaning. Rotating brushes are also suitable. The semiconductor wafer is preferably held vertically upright and rotated about its center during this treatment. Step f) of the method preferably lasts not less than 10 s and not more than 30 s. If the time period is shorter than 10 s, then this detrimentally affects the efficiency of the method, and if it is longer than 30 s, then this is detrimental to the productivity of the method.

Step g) of the method comprises spraying the side surfaces of the semiconductor wafer with water. The semiconductor wafer is preferably held vertically upright and rotated about its center during this treatment. Step g) preferably lasts not less than 5 s and not more than 10 s. If the time period is shorter than 5 s, then this detrimentally affects the efficiency of the method, and if it is longer than 10 s, then this is detrimental to the productivity of the method.

Step h) of the method comprises drying the semiconductor wafer in a drying module. A drying module in which drying is effected in the presence of isopropanol vapor is particularly preferred. The drying lasts preferably not less than 45 s and preferably not more than 65 s.

The method according to embodiments of the invention is suitable for cleaning semiconductor wafers composed of silicon, in particular those having diameters in the range of 200 to 450 mm.

EXAMPLE 1

Semiconductor wafers composed of silicon were subjected to chemical mechanical polishing and cleaned after the polishing process in the manner according to an embodiment of the invention. The efficiency of the method was manifested in the number of particles measured on the semiconductor wafers prior to packaging and sending to the customer. In the case of half of the semiconductor wafers examined, not more than 5 particles having a maximum linear extent of more than 37 nm were found. In a comparative fashion, semiconductor wafers were also cleaned according to a standard method. In the case of these semiconductors wafers, the corresponding number of particles was in the range of 15 to 20.

EXAMPLE 2

Figure 1:
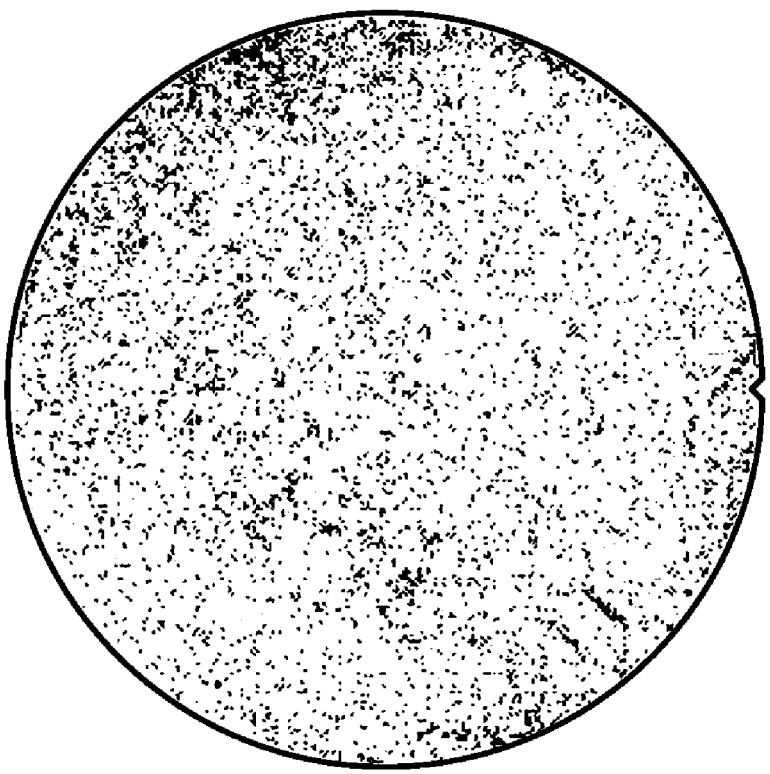
FIG. 1 shows a map of particles found on a semiconductor wafer cleaned by a first method.

In order to show the importance of the surfactant during step c), a first and a second group of semiconductor wafers were subjected to chemical mechanical polishing and cleaned. Each group comprised 40 semiconductor wafers composed of silicon. The cleaning of the second group directly after the polishing process was effected according to an embodiment of the invention. The cleaning of the first group differed therefrom merely in that the surfactant was dispensed with during step c). The cleaned semiconductor wafers were subjected to a final cleaning corresponding to a known method and examined for the presence of particles having a size of 40 nm or greater. FIGS. 1 and 2 show maps of the particles found on the front side, wherein each map indicates the total of the particles found on the polished front sides of the semiconductor wafers of the respective group of semiconductor wafers. The comparison of FIG. 1 and FIG. 2 shows that the number of particles found on the front side of semiconductor wafers cleaned according to the invention (second group, FIG. 2) was significantly lower than the number found in the case of the semiconductor wafers not cleaned according to the invention (first group, FIG. 1).

EXAMPLE 3

Figure 4:
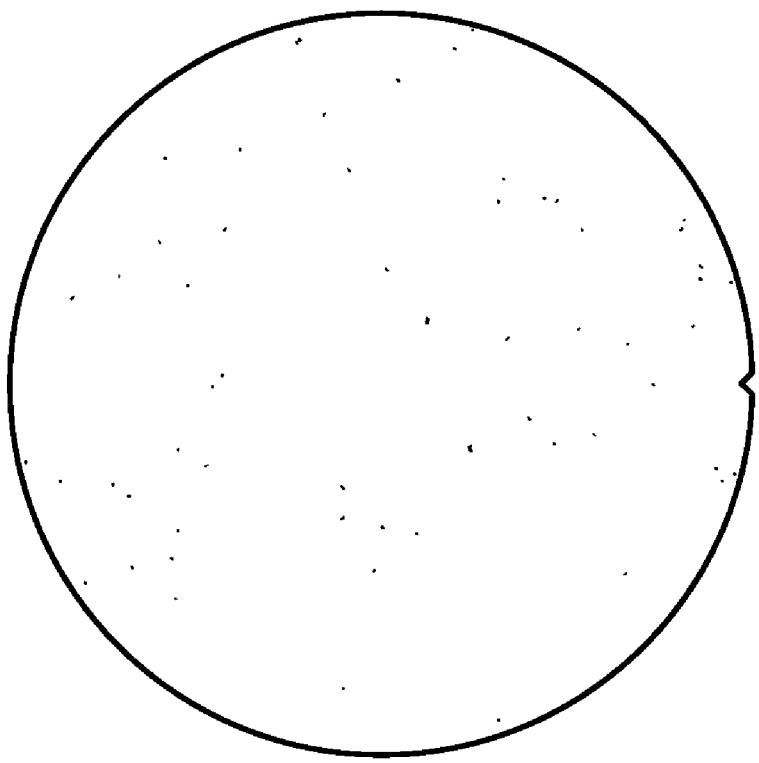
FIG. 4 shows a map of particles found on a semiconductor wafer cleaned in accordance with the invention.
Figure 3:
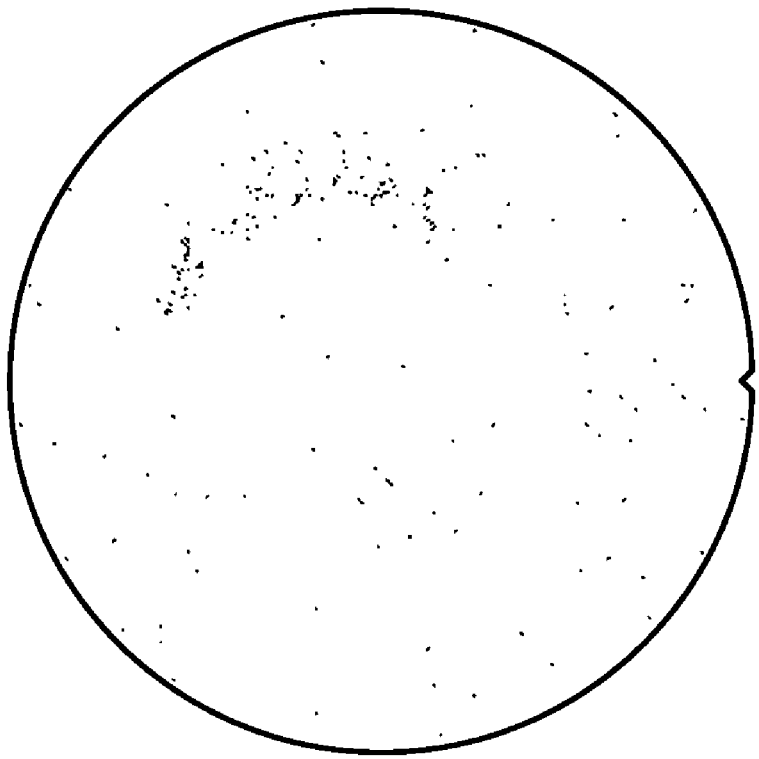
FIG. 3 shows a map of particles found on a semiconductor wafer cleaned by another method.

In order to show the importance of the pressure during step c), a third and a fourth group of semiconductor wafers were subjected to chemical mechanical polishing and cleaned. Each group comprised 10 semiconductor wafers composed of silicon. The cleaning of the fourth group directly after the polishing process was effected according to the invention. The cleaning of the third group differed therefrom merely in that the aqueous solution during step c) was sprayed onto the side surfaces of the semiconductor wafers at a pressure of 100 000 Pa. A corresponding pressure of 60 000 Pa was set for cleaning the semiconductor wafers of the fourth group. The cleaned semiconductor wafers were subjected to a final known cleaning and examined for the presence of particles having a size of 40 nm or greater. FIGS. 3 and 4 show maps of the particles found on the front side, wherein each map indicates the total of the particles found on the front sides of the semiconductor wafers of the respective group of semiconductor wafers. The comparison of FIG. 3 and FIG. 4 shows that the number of particles found on the front side of semiconductor wafers cleaned according to the invention (fourth group, FIG. 4) was significantly lower than the number found in the case of the semiconductor wafers not cleaned according to the invention (third group, FIG. 3).

While the invention has been particularly shown and described with reference to preferred embodiments thereof, it will be understood by those skilled in the art that various changes in form and details may be made therein without departing from the spirit and scope of the invention.

What is claimed is:

1. A method for cleaning a semiconductor wafer composed of silicon directly after a process of chemical mechanical polishing of the semiconductor wafer, the method comprising the following steps in the order indicated:
    a) transferring the semiconductor wafer from a polishing plate to a first cleaning module, and spraying both side surfaces of the semiconductor wafer with water at a pressure no greater than 1000 Pa at least once while transferring the semiconductor wafer;
    b) cleaning the semiconductor wafer between rotating rollers with a supply of water;
    c) spraying the side surfaces of the semiconductor wafer with an aqueous solution containing hydrogen fluoride and a surfactant at a pressure no greater than 70,000 Pa;
    d) spraying the side surfaces of the semiconductor wafer with water at a pressure no greater than 20,000 Pa;
    e) dipping the semiconductor wafer into an aqueous alkaline cleaning solution;
    f) cleaning the semiconductor wafer between rotating rollers with a supply of water;
    g) spraying the semiconductor wafer with water; and
    h) drying the semiconductor wafer.

2. The method recited in claim 1, wherein steps b) through d) are performed in the first cleaning module, step e) is performed in a second cleaning module, and steps f) and g) are performed in a third cleaning module.

3. The method recited in claim 1, wherein steps b) through g) include holding the semiconductor wafer vertically upright and rotating the semiconductor wafer about a center thereof.

4. The method as recited in claim 1, wherein:
    step b) is performed in a time period in a range of 10 s to 30 s,
    step c) is performed in a time period in a range of 20 s to 30 s,
    step d) is performed in a time period in a range of 1 s to 10 s,
    step e) is performed in a time period in a range of 40 s to 60 s,
    step f) is performed in a time period in a range of 10 s to 30 s, and
    step g) is performed in a time period in a range of 5 s to 10 s.

5. The method recited in claim 1, wherein an elapsed time from the transferring of the semiconductor wafer from the polishing plate in step a) through complete drying of the semiconductor wafer in step h) is no greater than 360 s.

6. The method as recited in claim 1, further comprising discharging the wafer dried during step h) after a cycle time of no more than 75 s.

7. The method recited in claim 1, wherein the cleaned semiconductor wafer has a diameter in a range of 200 mm to 450 mm.

* * * * *